United States Patent
Lee et al.

(10) Patent No.: US 6,456,091 B1
(45) Date of Patent: Sep. 24, 2002

(54) POWER LINE CONDITIONER WITH VOLTAGE AND CURRENT AMPLITUDE TRACKING

(75) Inventors: Kendrew Lee, Fremont; Noel Lee, Daley City, both of CA (US)

(73) Assignee: Monster Cable Products, Inc., Brisbane, CA (US)

( * ) Notice: Subject to any disclaimer, the term of this patent is extended or adjusted under 35 U.S.C. 154(b) by 8 days.

(21) Appl. No.: 09/755,946

(22) Filed: Jan. 5, 2001

(51) Int. Cl.[7] .............................................. H01H 31/02
(52) U.S. Cl. ...................... 324/556; 340/642
(58) Field of Search ................. 324/555, 556, 324/508, 156, 115; 340/649, 642, 664, 815.45, 815.56, 815.67

(56) References Cited

U.S. PATENT DOCUMENTS

| | | | |
|---|---|---|---|
| 4,092,591 A | * 5/1978 | Lozowski | 324/115 |
| 4,912,590 A | * 3/1990 | Misencik | 361/56 |
| 5,339,017 A | * 8/1994 | Yang | 340/636 |
| 5,583,413 A | * 12/1996 | Proctor | 324/427 |
| 6,054,849 A | * 4/2000 | Collier | 324/556 |
| 6,323,652 B1 | * 11/2001 | Collier | 324/508 |

* cited by examiner

*Primary Examiner*—Christine Oda
(74) *Attorney, Agent, or Firm*—LaRiviere, Grubman & Payne, LLP

(57) ABSTRACT

An apparatus and a method using a power line conditioner having a conventional grounded plug disposed at one end of a short three-wire cord and a housing disposed at the opposite end for providing surge protection, voltage and current amplitude monitoring and indication, as well as visual indication of other singular conditions such as "power on," "adequate ground," etc., and outlets for receiving the connecting cord plugs of the electronic equipment to be protected.

22 Claims, 5 Drawing Sheets

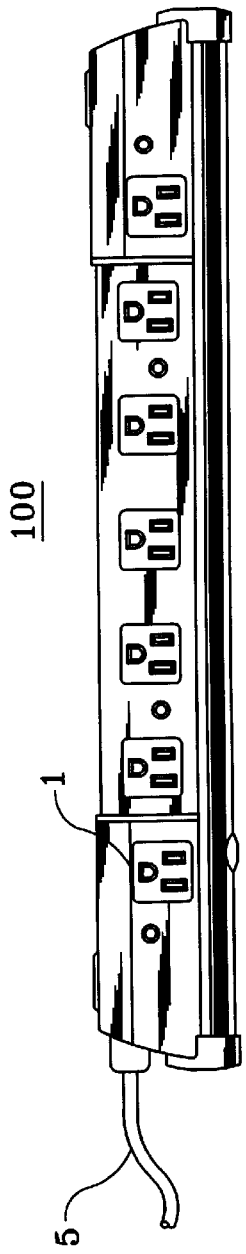
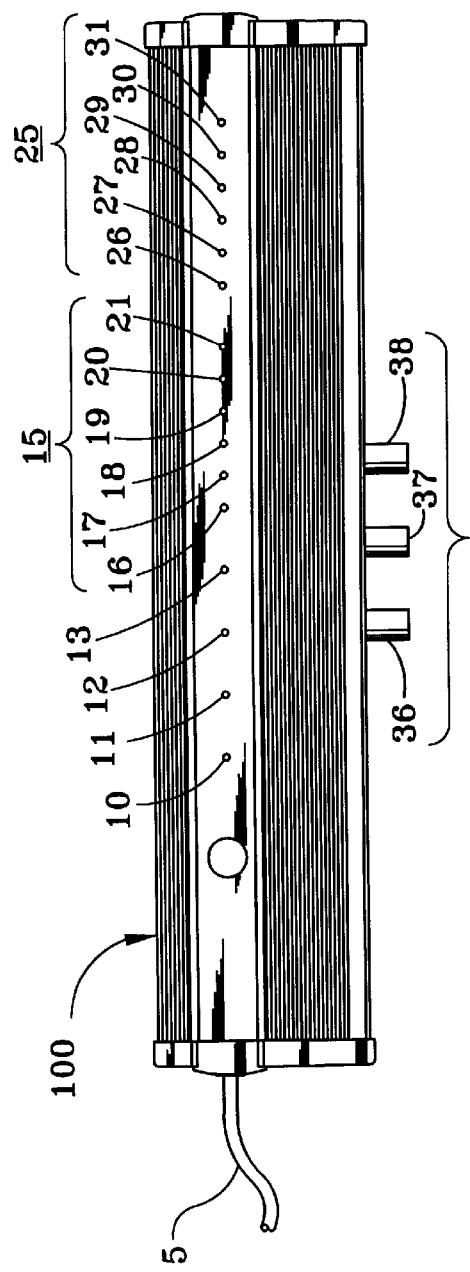
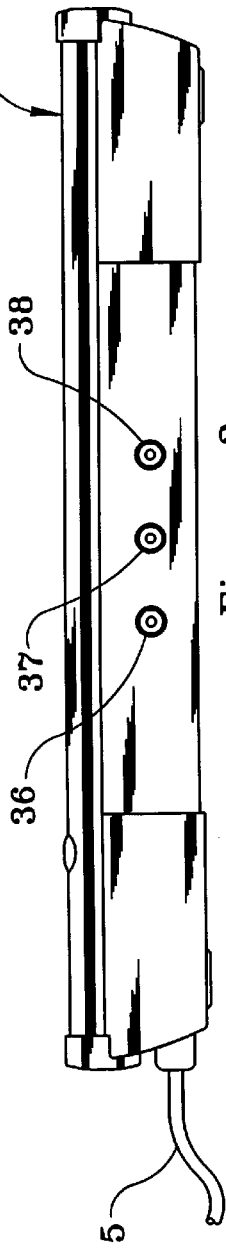
Figure 1
Figure 2
Figure 3

POWER LINE CONDITIONER WITH VOLTAGE AND CURRENT AMPLITUDE TRACKING

FIELD OF THE INVENTION

The present invention is related to power line devices for monitoring typical consumer-level voltage and current levels, and, more specifically, to multi-tap devices for coupling several electrically powered devices to a single outlet, for providing power line filtering and surge protection and visual indications of voltage, current and other parameters of interest to the consumer.

BACKGROUND OF THE INVENTION

The advent of sensitive electronic devices in the consumer market has created a need to protect such devices from spurious and potentially damaging electrical spikes. Consumer electronics, such as computers and televisions and their associated peripherals, contain microcircuit electronics which are readily damaged by out-of-specification electrical power. Currently, multi-tap extension cords that plug into a single wall outlet allow more than one device to be plugged into the cord. Related-art cords are also provided with circuitry that protects the electrically-coupled peripheral devices from surges or spikes of high current or voltage. However, the related-art cords do not conveniently inform the user of high, low, marginal, or out-of-tolerance power conditions that would be detrimental to the coupled electronic equipment. Additionally, the related-art cords do not provide power line filtering. Therefore a need exists for a power line conditioner which provides both surge and noise protection and monitoring of non-surge out-of-tolerance power conditions.

BRIEF SUMMARY OF THE INVENTION

The present invention apparatus and method comprises a power line conditioner having a conventional grounded plug disposed at one end of a short three-wire cord and a housing disposed at the opposite end for providing power line filtering and surge protection, voltage and current amplitude monitoring and indication, as well as visual indication of other singular conditions such as "power on," "adequate ground," etc., and outlets for receiving the connecting power plugs of the electronic equipment to be protected.

BRIEF DESCRIPTION OF THE DRAWINGS

For a fuller understanding of the present invention, reference is made to the accompanying drawings in the following section entitled Detailed Description of the Invention and Best Mode of the invention. Reference numbers refer to the same or equivalent parts of the present invention throughout the several figures of the drawings.

FIG. 1 of one side of an exemplary model of the invention, in accordance with the present invention.

FIG. 2 a of an exemplary view of the invention, in accordance with the present invention.

FIG. 3 a view of the side opposite of FIG. 1 in the exemplary model, in accordance with the present invention.

DETAILED DESCRIPTION OF THE INVENTION AND BEST MODE OF THE INVENTION

The present invention apparatus and method comprises a power line conditioner having a conventional grounded plug disposed at one end of a short three-wire cord and a housing disposed at the opposite end for providing power line filtering, surge protection, voltage and current amplitude monitoring and indication, as well as visual indication of other singular conditions such as "power on," "adequate ground," etc., and outlets for receiving the connecting cord plugs of the electronic equipment to be protected, hereinafter collectively referred to as "protected devices."

Figure 4A:
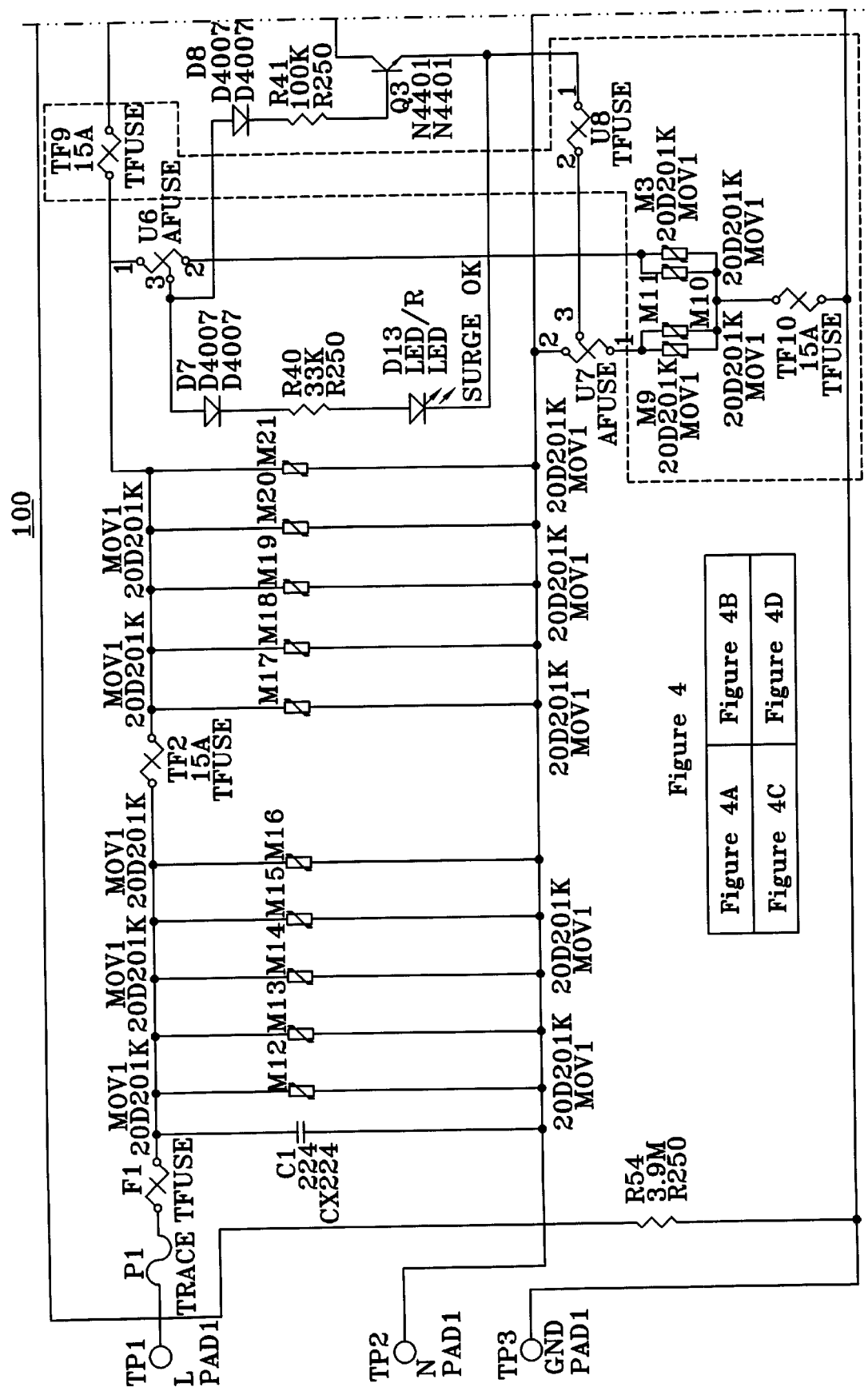
FIG. 4 is a schematic of the present invention, in accordance with the present invention.
Figure 4B:
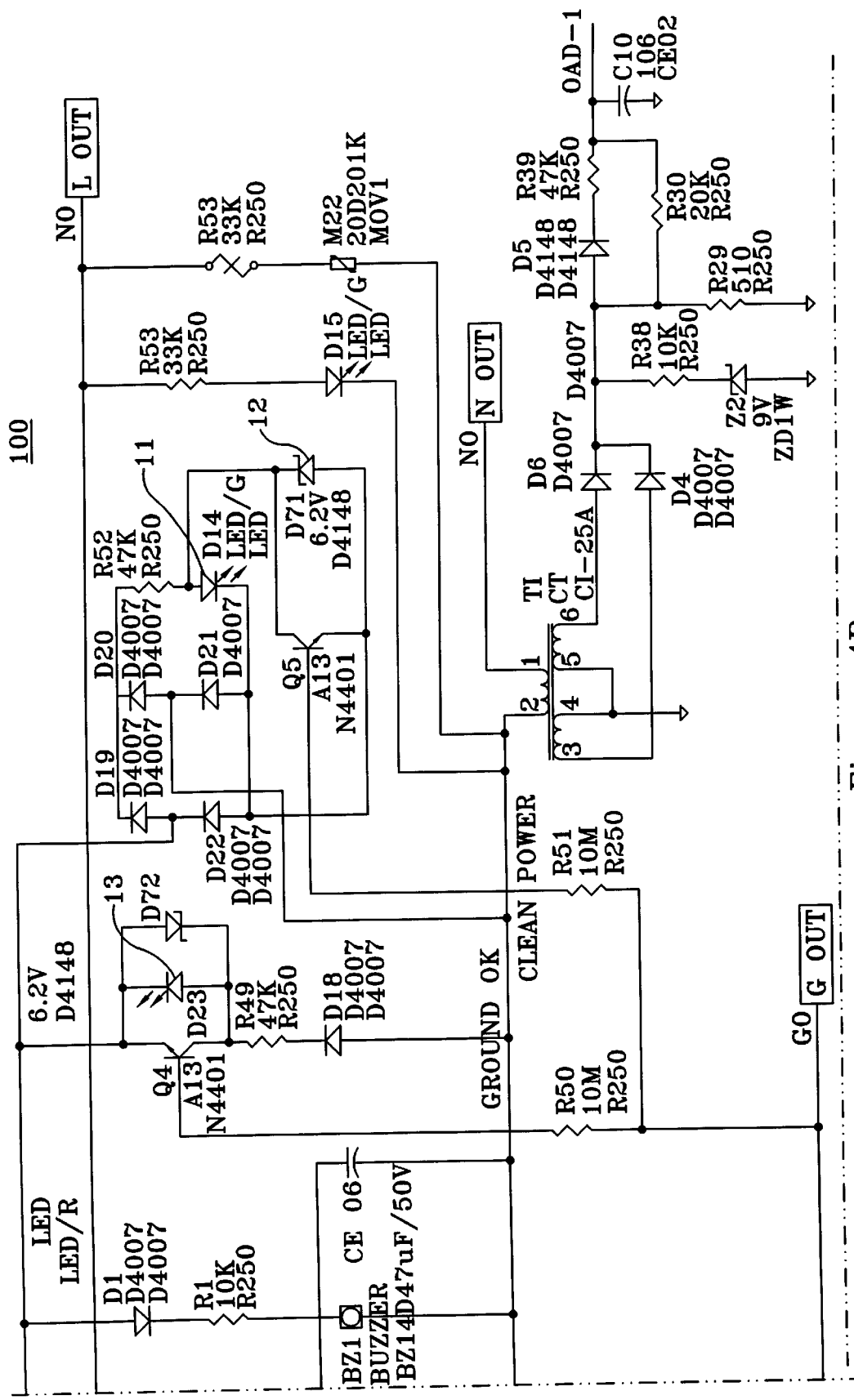
Figure 4C:
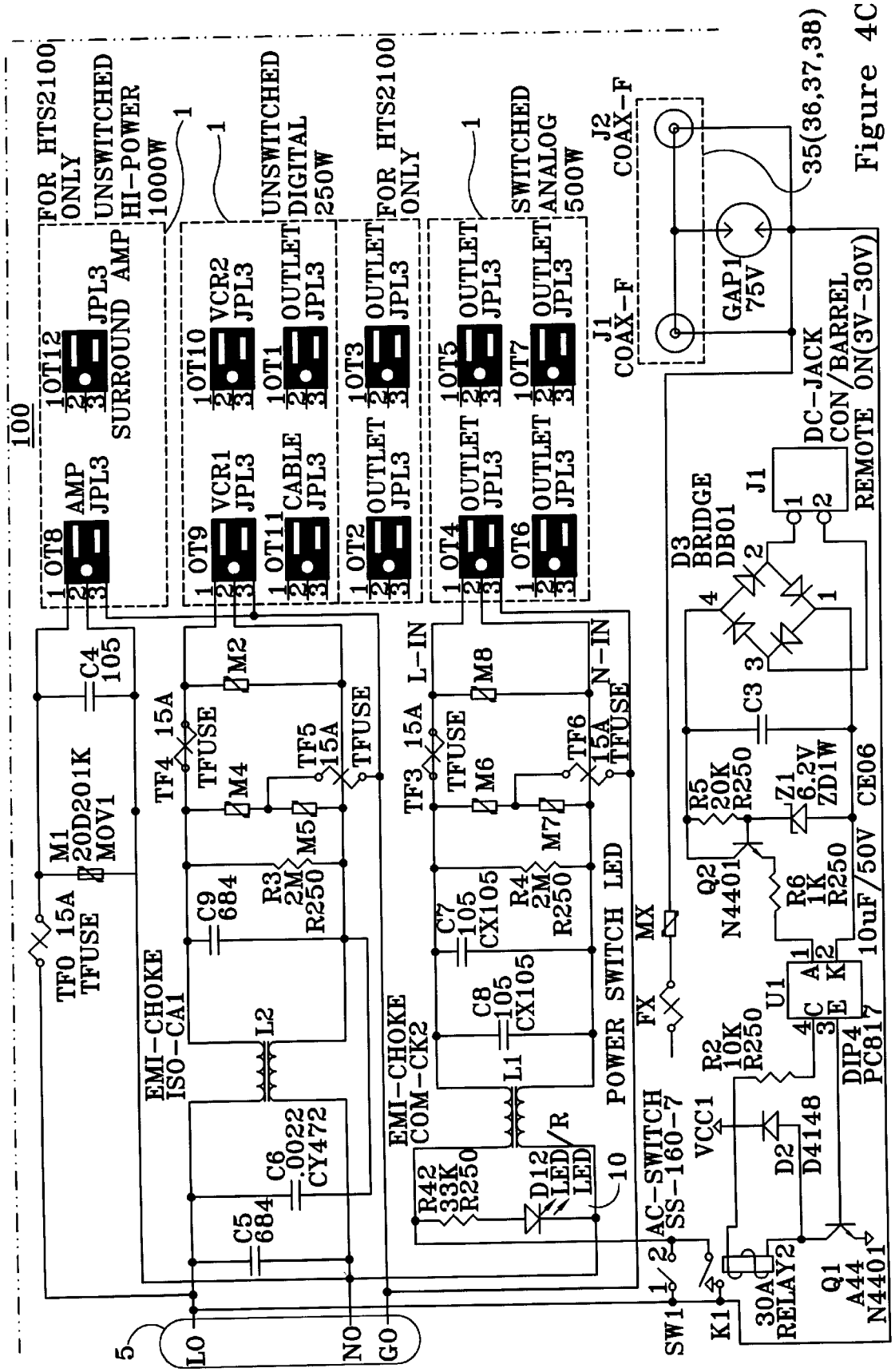
Figure 4D:
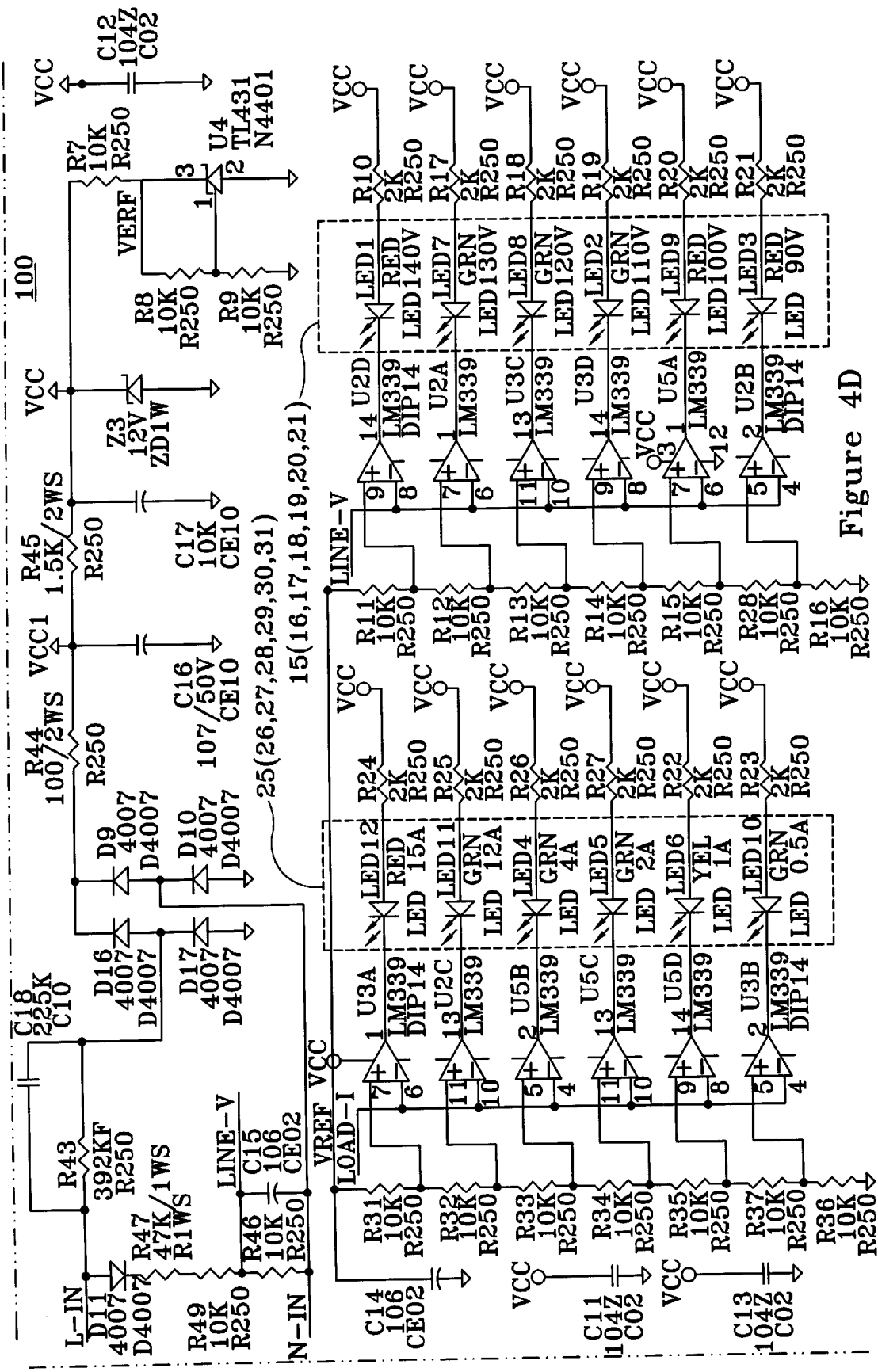

In a preferred embodiment, the present invention apparatus is a power line conditioner for protecting and monitoring power to a television system, such as found in the home. Referring to FIG. 1, one side of an exemplary model of the present invention power line conditioner 100 is shown which comprises a plurality of electrical outlets 1, each outlet 1 is of a conventional design for receiving two-prong or three-prong electrical plugs such as those found in televisions, video recorder/playback devices, television cable converter boxes, and the like. The plurality of outlets 1 may be of any number, but preferably between 4 and 12. Electrically coupled to the power line conditioner 100 is power cord 5 which is a three-wire electrical cord of sufficient gauge for carrying the current for which the power line conditioner 100 is rated and in compliance with electrical codes. By example, the plurality of outlets 1 may supply unswitched high power voltages, unswitched digital voltages, and switched analog voltages (See FIG. 4). A plug of grounded design (not shown) for connecting power line conditioner 100 to a power source is disposed at the end of cord 5.

Referring to FIG. 2, the top of power line conditioner 100 is shown. A first group of four light emitting diode (LED) indicators is disposed at one end of the power line conditioner 100. A first indicator 10 indicates a "power on" condition and is colored green, although white or another non-alarming color may be used. A second indicator 11 indicates a "ground ok" condition and may also be preferably colored green. A third indicator 12 indicates "clean power on" condition and may be colored blue. The "clean power on" indicator 12 also shows that the filter circuit (i.e., the circuit which filters/reduces the noise in the AC source from a wall AC outlet) is functioning. A fourth indicator 13 indicates a "wiring correct" condition. The indicators 12, 13 also may be preferably colored green to indicate acceptable status, but another, non-alarming color may also be used. Alternatively, indicator 13 may be colored red to indicate the power plug has been incorrectly coupled. In this embodiment, indicator 13 alerts the user to a potential hazard because the LINE wire and the NEUTRAL wire have been reversely or incorrectly wired in the AC wall outlet.

A second group of LED indicators 15 indicates the status of the voltage being supplied to the power line conditioner 100. A first LED 16 indicates 90 volts or less, and is colored red. A second LED 17 indicates 100 volts or less and is also colored red. The red colors visually alert the user that the voltage is too low and that the protected devices should not be "turned on." A third LED 18 indicates 110 volts or less and a fourth LED 19 indicates 120 volts or less. Both are preferably colored green to visually inform the user that the voltage is acceptable and the protected devices may be "turned on." A fifth LED 20 indicates that the output voltage is 130 volts or less and is colored yellow to visually indicate a marginal condition. The sixth LED 21 indicates 140 volts or more and is colored red to visually indicate that the conditions are not safe for "turning on" the peripheral devices.

A third group of LED indicators 25 indicates the status of the current collectively supplied by the power line conditioner 100 to the protected devices. A first indicator 26 indicates 0.5 amp, the second indicator 27 indicates 1 amp, the third indicator 28 indicates 2 amps, and the fourth indicator 29 indicates 4 amps. These four indicators are preferably colored green. Other current values could be indicated if desired. The fifth indicator 30 indicates 12 amps and is preferably colored yellow to visually indicate that power line conditioner 100 is nearing its rated limit. The sixth indicator 31 indicates 15 amps or any other maximum value for which power line conditioner 100 is rated. This indicator 31 is colored red to visually indicate that no additional protected device should be "turned on."

Referring now to FIGS. 2 and 3, a coaxial connector group 35 is shown. The present invention contemplates and is compatible with the use of three connectors: a cable connector 36, a satellite connector 37, and an antenna connector 38, but additional coaxial connectors could also be provided. The power line conditioner 100 also provides surge protection/suppression to input from a wall cable outlet (CATV), a satellite dish (SAT), or an antenna (ANTENNA) while maintaining minimum signal loss.

Although specific colors, numbers of LEDs, and specific voltage and current values have been described, the inventor fully understands and contemplates that fewer or more LED indicators or different indicator colors or values may be used without departing from the spirit of the invention. Additionally, information about the meaning of each LED indicator could be embossed, labeled, or imprinted in some manner on the housing of power line conditioner 100 adjacent to each indicator. Further, the preferred embodiment housing is contemplated to have an elongate form as indicated by the figures, but other shapes may be utilized.

Referring now to FIG. 4, the electrical circuitry contemplated for providing surge protection and monitoring current and voltage values is illustrated. In an alternative embodiment, the power line conditioner 100 may further comprise voltage and current amplitude tracking for electronic devices such as computers and their peripherals. In this embodiment, the coaxial group 35 could be deleted without detracting from the basic teaching of the present invention. Information as herein shown and described in detail is fully capable of attaining the above-described object of the invention, the presently preferred embodiment of the invention, and is, thus, representative of the subject matter which is broadly contemplated by the present invention. The scope of the present invention fully encompasses other embodiments which may become obvious to those skilled in the art, and is to be limited, accordingly, by nothing other than the appended claims, wherein reference to an element in the singular is not intended to mean "one and only one" unless explicitly so stated, but rather "one or more." All structural and functional equivalents to the elements of the above-described preferred embodiment and additional embodiments that are known to those of ordinary skill in the art are hereby expressly incorporated by reference and are intended to be encompassed by the present claims. Moreover, no requirement exists for a device or method to address each and every problem sought to be resolved by the present invention, for such to be encompassed by the present claims. Furthermore, no element, component, or method step in the present disclosure is intended to be dedicated to the public regardless of whether the element, component, or method step is explicitly recited in the claims. However, it should be readily apparent to those of ordinary skill in the art that various changes and modifications in form, semiconductor material, and fabrication material detail may be made without departing from the spirit and scope of the inventions as set forth in the appended claims. No claim herein is to be construed under the provisions of 35 U.S.C. 112, sixth paragraph, unless the element is expressly recited using the phrase "means for."

What is claimed:

1. An electrical apparatus, said apparatus comprising:
    an electrical cord having a plug for continuously receiving electrical power from an external power source;
    at least one power line filtering means;
    at least one power outlet having power surge protection for distributing said filtered power to at least one peripheral device;
    at least one light indicator means for indicating a power supply status selected from a group of power status conditions consisting essentially of "power on," "ground OK," "clean power on," and "wiring correct;"
    at least one voltage range circuit means for determining and indicating an input voltage amplitude; and
    at least one current range circuit means for determining and indicating an input current amplitude.

2. The apparatus, as recited in claim 1, wherein the at least one power outlet may supply a voltage selected from a group of voltages consisting essentially of an unswitched high power voltage, an unswitched digital voltage, and a switched analog voltage.

3. The apparatus, as recited in claim 1, further comprising at least one coaxial connector circuit means for providing surge protection and suppression from spurious voltages emanating from an external signal source.

4. The apparatus, as recited in claim 3, wherein said at least one coaxial connector circuit means is selected from a group of connectors consisting essentially of a cable connector, a satellite connector, and an antenna connector.

5. The apparatus, as recited in claim 1, wherein said at least one light indicator means comprises a first group of light emitting diode (LED) indicators, said first LED indicator group comprising:
    said first LED indicator displaying a "power on" condition;
    said second LED indicator displaying a "ground OK" condition;
    said third LED indicator displaying a "clean power on" condition; and
    said fourth LED indicator displaying a "wiring correct" condition.

6. The apparatus, as recited in claim 1, wherein said at least one voltage range circuit means comprises a second group of light emitting diode (LED) indicators, said second LED indicator group comprising:
    said first LED indicator warning of voltage in a range of 90 volts or less;
    said second LED indicator warning of voltage in a range of 100 volts or less;
    said third LED indicator warning of voltage in a range of 110 volts or less;
    said fourth LED indicator warning of voltage in a range of 120 volts or less;
    said fifth LED indicator warning of an output voltage in a range of 130 volts or less; and
    said sixth LED indicator warning of voltage in a range of 140 volts or more.

7. The apparatus, as recited in claim 1, wherein said at least one current range circuit means comprises a third group of light emitting diode (LED) indicators, said third LED indicator group comprising:

said first LED indicator warning of current in a range of greater than 0.5 ampere;

said second LED indicator warning of current in a range of greater than 1 ampere;

said third LED indicator warning of current in a range of greater than 2 amperes;

said fourth LED indicator warning of current in a range of greater than 4 amperes;

said fifth LED indicator warning of current in a range of greater than 12 amperes; and said sixth LED indicator warning of current in a range of greater than 15 amperes.

8. The apparatus, as recited in claim 5, wherein the at least one power outlet may supply a voltage selected from a group of voltages consisting essentially of an unswitched high power voltage, an unswitched digital voltage, and a switched analog voltage.

9. The apparatus, as recited in claim 5, further comprising at least one coaxial connector circuit means for providing surge protection and suppression from spurious voltages emanating from an external signal source.

10. The apparatus, as recited in claim 9, wherein said at least one coaxial connector circuit means is selected from a group of connectors consisting essentially of a cable connector, a satellite connector, and an antenna connector.

11. An electrical apparatus, said apparatus comprising:

an electrical cord having a plug for continuously receiving electrical power from an external power source;

at least one power line filtering means;

at least one power outlet having power surge protection for distributing said filtered power to at least one peripheral device;

at least one light indicator means for indicating a power supply status selected from a group of power status conditions consisting essentially of "power on," "ground OK," "clean power on," and "wiring correct;"

at least one voltage range circuit means for determining and indicating an input voltage amplitude; and at least one current range circuit means for determining and indicating an input current amplitude; and at least one coaxial connector circuit means for providing surge protection and suppression from spurious voltages emanating from an external signal source, wherein the at least one power outlet may supply a voltage selected from a group of voltages consisting essentially of an unswitched high power voltage, an unswitched digital voltage, and a switched analog voltage, wherein said at least one coaxial connector circuit means is selected from a group of connectors consisting essentially of a cable connector, a satellite connector, and an antenna connector, wherein said at least one light indicator means comprises a first group of light emitting diode (LED) indicators, said first LED indicator group comprising:

a first LED indicator displaying a "power on" condition, a second LED indicator displaying a "ground OK" condition, a third LED indicator displaying a "clean power on" condition, and a fourth LED indicator displaying a "wiring correct" condition, wherein said at least one voltage range circuit means comprises a second group of LED indicators, said second LED indicator group comprising:

a first LED indicator warning of voltage in a range of 90 volts or less, a second LED indicator warning of voltage in a range of 100 volts or less, a third LED indicator warning of voltage in a range of 110 volts or less, a fourth LED indicator warning of voltage in a range of 120 volts or less, a fifth LED indicator warning of an output voltage in a range of 130 volts or less, and a sixth LED indicator warning of voltage in a range of 140 volts or more, and wherein said at least one current range circuit means comprises a third group of LED indicators, said third LED indicator group comprising:

a first LED indicator warning of current in a range of greater than 0.5 ampere, a second LED indicator warning of current in a range of greater than 1 ampere, a third LED indicator warning of current in a range of greater than 2 amperes, a fourth LED indicator warning of current in a range of greater than 4 amperes, a fifth LED indicator warning of current in a range of greater than 12 amperes, and a sixth LED indicator warning of current in a range of greater than 15 amperes.

12. A method for conditioning power, said method comprising:

providing an electrical cord having a plug for continuously receiving electrical power from an external power source;

providing at least one power line filtering means;

providing at least one power outlet having power surge protection for distributing said filtered power to at least one peripheral device;

providing at least one light indicator means for indicating a power supply status selected from a group of power status conditions consisting essentially of "power on," "ground OK," "clean power on," and "wiring correct;"

providing at least one voltage range circuit means for determining and indicating an input voltage amplitude; and providing at least one current range circuit means for determining and indicating an input current amplitude.

13. The method, as recited in claim 12, wherein the at least one power outlet may supply a voltage selected from a group of voltages consisting essentially of an unswitched high power voltage, an unswitched digital voltage, and a switched analog voltage.

14. The method, as recited in claim 12, further comprising the step of providing at least one coaxial connector circuit means for providing surge protection and suppression from spurious voltages emanating from an external signal source.

15. The method, as recited in claim 14, wherein said at least one coaxial connector circuit means is selected from a group of connectors consisting essentially of a cable connector, a satellite connector, and an antenna connector.

16. The method, as recited in claim 12, wherein said at least one light indicator means comprises a first group of light emitting diode (LED) indicators, said first LED indicator group comprising:

said first LED indicator displaying a "power on" condition;

said second LED indicator displaying a "ground OK" condition;

said third LED indicator displaying a "clean power on" condition; and said fourth LED indicator displaying a "wiring correct" condition.

17. The method, as recited in claim 12, wherein said at least one voltage range circuit means comprises a second group of light emitting diode (LED) indicators, said second LED indicator group comprising:

said first LED indicator warning of voltage in a range of 90 volts or less;

said second LED indicator warning of voltage in a range of 100 volts or less;

said third LED indicator warning of voltage in a range of 110 volts or less;

said fourth LED indicator warning of voltage in a range of 120 volts or less;

said fifth LED indicator warning of an output voltage in a range of 130 volts or less; and said sixth LED indicator warning of voltage in a range of 140 volts or more.

18. The method, as recited in claim 12, wherein said at least one current range circuit means comprises a third group of light emitting diode (LED) indicators, said third LED indicator group comprising:

said first LED indicator warning of current in a range of greater than 0.5 ampere;

said second LED indicator warning of current in a range of greater than 1 ampere;

said third LED indicator warning of current in a range of greater than 2 amperes;

said fourth LED indicator warning of current in a range of greater than 4 amperes;

said fifth LED indicator warning of current in a range of greater than 12 amperes; and said sixth LED indicator warning of current in a range of greater than 15 amperes.

19. The method, as recited in claim 14, wherein the at least one power outlet may supply a voltage selected from a group of voltages consisting essentially of an unswitched high power voltage, an unswitched digital voltage, and a switched analog voltage.

20. The method, as recited in claim 13, further comprising the step of providing at least one coaxial connector circuit means for providing surge protection and suppression from spurious voltages emanating from an external signal source.

21. The method, as recited in claim 20, wherein said at least one coaxial connector circuit means is selected from a group of connectors consisting essentially of a cable connector, a satellite connector, and an antenna connector.

22. A method for conditioning power, said method comprising:

providing an electrical cord having a plug for continuously receiving electrical power from an external power source;

providing at least one power line filtering means;

providing at least one power outlet having power surge protection for distributing said filtered power to at least one peripheral device;

providing at least one light indicator means for indicating a power supply status selected from a group of power status conditions consisting essentially of "power on," "ground OK," "clean power on," and "wiring correct;"

providing at least one voltage range circuit means for determining and indicating an input voltage amplitude;

providing at least one current range circuit means for determining and indicating an input current amplitude; and providing at least one coaxial connector circuit means for providing surge protection and suppression from spurious voltages emanating from an external signal source, wherein the at least one power outlet may supply a voltage selected from a group of voltages consisting essentially of an unswitched high power voltage, an unswitched digital voltage, and a switched analog voltage, wherein said at least one coaxial connector circuit means is selected from a group of connectors consisting essentially of a cable connector, a satellite connector, and an antenna connector, wherein said at least one light indicator means comprises a first group of light emitting diode (LED) indicators, said first LED indicator group comprising:

a first LED indicator displaying a "power on" condition, a second LED indicator displaying a "ground OK" condition, a third LED indicator displaying a "clean power on" condition, and a fourth LED indicator displaying a "wiring correct" condition, wherein said at least one voltage range circuit means comprises a second group of LED indicators, said second LED indicator group comprising:

a first LED indicator warning of voltage in a range of 90 volts or less, a second LED indicator warning of voltage in a range of 100 volts or less, a third LED indicator warning of voltage in a range of 110 volts or less, a fourth LED indicator warning of voltage in a range of 120 volts or less, a fifth LED indicator warning of an output voltage in a range of 130 volts or less, and a sixth LED indicator warning of voltage in a range of 140 volts or more, and wherein said at least one current range circuit means comprises a third group of LED indicators, said third LED indicator group comprising:

a first LED indicator warning of current in a range of greater than 0.5 ampere, a second LED indicator warning of current in a range of greater than 1 ampere, a third LED indicator warning of current in a range of greater than 2 amperes, a fourth LED indicator warning of current in a range of greater than 4 amperes, a fifth LED indicator warning of current in a range of greater than 12 amperes, and a sixth LED indicator warning of current in a range of greater than 15 amperes.

* * * * *